United States Patent
Perlin et al.

(10) Patent No.: US 8,975,639 B2
(45) Date of Patent: Mar. 10, 2015

(54) SUBSTRATE FOR EPITAXIAL GROWTH

(75) Inventors: Piotr Perlin, Warsaw (PL); Marcin Sarzyński, Zabki (PL); Michal Leszczyński, Mysiadlo (PL); Robert Czernecki, Kalina (PL); Tadeusz Suski, Nowy Prażmów (PL)

(73) Assignee: Instytut Wysokich Ciśnień Polskiej Akademi Nauk, Warsaw (PL)

( * ) Notice: Subject to any disclaimer, the term of this patent is extended or adjusted under 35 U.S.C. 154(b) by 0 days.

(21) Appl. No.: 13/639,907

(22) PCT Filed: Mar. 15, 2011

(86) PCT No.: PCT/IB2011/051091
§ 371 (c)(1),
(2), (4) Date: Jan. 8, 2013

(87) PCT Pub. No.: WO2011/124997
PCT Pub. Date: Oct. 13, 2011

(65) Prior Publication Data
US 2013/0099246 A1  Apr. 25, 2013

(30) Foreign Application Priority Data
Apr. 6, 2010  (PL) .......................... 390926

(51) Int. Cl.
*C30B 29/40* (2006.01)
*B82Y 20/00* (2011.01)
(Continued)

(52) U.S. Cl.
CPC ............... *C30B 29/406* (2013.01); *B82Y 20/00* (2013.01); *C30B 25/18* (2013.01); *C30B 33/00* (2013.01); *C30B 33/12* (2013.01); *H01L 21/02389* (2013.01); *H01L 21/0243* (2013.01);
(Continued)

(58) Field of Classification Search
USPC .................. 257/76, 627, 5, 622, 615, 77, 330
See application file for complete search history.

(56) References Cited

U.S. PATENT DOCUMENTS 5,637,531 A * 6/1997 Porowski et al. ............... 117/89
2001/0030329 A1* 10/2001 Ueta et al. ..................... 257/103
(Continued)

FOREIGN PATENT DOCUMENTS

EP    1577933    9/2005
EP    1806770    7/2007
(Continued)

*Primary Examiner* — Chuong A Luu
*Assistant Examiner* — Rodolfo Fortich
(74) *Attorney, Agent, or Firm* — Horst M. Kasper

(57) ABSTRACT

A surface of a substrate consists of a plurality of neighboring stripes. Longer edges of the flat surfaces are parallel one to another and planes of these surfaces are disoriented relatively to the crystallographic plane of gallium nitride crystal defined by Miller-Bravais indices (0001), (11-22) or (11-20). The disorientation angle of each of the flat surfaces is between 0 and 3 degrees and is different for each pair of neighboring flat surfaces. The substrate according to the invention allows epitaxial growth of a layered AlInGaN structure by a MOCVD or MBE method which allow to obtain a non-absorbing mirrors laser diode emitting a light in the wavelength from 380 to 550 nm.

20 Claims, 7 Drawing Sheets

(51) Int. Cl.

| | | |
|---|---|---|
| *C30B 25/18* | (2006.01) | |
| *C30B 33/00* | (2006.01) | |
| *C30B 33/12* | (2006.01) | |
| *H01L 21/02* | (2006.01) | |
| *H01S 5/343* | (2006.01) | |
| *H01L 29/20* | (2006.01) | |
| *H01L 33/00* | (2010.01) | |
| *H01S 5/02* | (2006.01) | |
| *H01S 5/20* | (2006.01) | |
| *H01S 5/32* | (2006.01) | |
| *H01S 5/34* | (2006.01) | |
| *H01S 5/40* | (2006.01) | |

(52) U.S. Cl.
CPC ...... *H01L21/02433* (2013.01); *H01L 21/0254* (2013.01); *H01S 5/34333* (2013.01); *H01L 29/2003* (2013.01); *H01L 33/007* (2013.01); *H01L 33/0075* (2013.01); *H01S 5/0202* (2013.01); *H01S 5/0207* (2013.01); *H01S 5/2009* (2013.01); *H01S 5/3202* (2013.01); *H01S 5/3403* (2013.01); *H01S 5/4087* (2013.01); *H01S 2304/04* (2013.01)
USPC ............... 257/76; 438/47; 438/137; 438/270; 438/700; 438/478

(56) References Cited

U.S. PATENT DOCUMENTS

| | | | |
|---|---|---|---|
| 2005/0104162 A1* | 5/2005 | Xu et al. | ........................ 257/627 |
| 2005/0218414 A1 | 10/2005 | Ueda et al. | |

FOREIGN PATENT DOCUMENTS

| | | |
|---|---|---|
| EP | 2003230 | 12/2008 |
| GB | 240770 A | 5/2005 |
| JP | 2000294875 A | 10/2000 |
| PL | 368483 | 12/2005 |
| PL | 368781 | 12/2005 |
| WO | WO 2004053210 A1 | 6/2004 |
| WO | WO 2005/121415 A1 | 12/2005 |

* cited by examiner

SUBSTRATE FOR EPITAXIAL GROWTH

The subject of this invention is a substrate for epitaxial growth made of a gallium nitride crystal, having one surface prepared for the epitaxial growth as well as application of such substrate for fabrication of semiconductor light emitters.

Since a long time the semiconductor structures have been fabricated using various epitaxial growth methods in which a substrate where the growth is initiated plays a one of key roles. A short-wavelength (360-530 nm) semiconductor light emitters such as electroluminescent diodes and laser diodes are usually fabricated in epitaxial growth on monocrystalline gallium nitride substrate. For preparing the substrate a gallium nitride crystal is treated for obtaining a substantially flat growth surface. An example method of GaN substrate preparation has been disclosed in PL180448. In the publication has been disclosed a certain disorientation of the surface with relation to crystallographic planes of the gallium nitride crystal which is advantageous for the epitaxial growth. Influence of the substrate surface disorientation on the epitaxial growth, among others on laser structures growth, discloses publication P. Perlin, et al. *"Nitride-based quantum structures and devices on modified GaN substrates"*, Phys. Stat sol (a) 206, 1130 (2009). The drawback of laser diodes fabricated on such known substrates is the presence of the effect of Catastrophic Optical Mirror Damage which is connected with the light absorption in the regions adjacent to the laser diode facets. In order to eliminate this effect it is necessary to increase the energy gap of the material in certain regions of the structure. This may be achieved, in case of the classical GaInAlAsP laser structure either by a cumbersome and not practical procedure of etching and regrowth of the active layer of the structure or by more practical and economical method so called "quantum well intermixing" which leads to the interdiffusion of the quantum well. This latter approach requires covering the surface of the laser structure with various types of oxides and a subsequent annealing. However, this method was never shown to be effective in case of gallium nitride making a task of a local controlling of quantum well composition very difficult. The method of fabrication of laser diodes with non absorbing mirrors has been disclosed for example in publication J. H. Marsh *"Quantum well intermixing" Semicond. Sci. Technol.* 8 1136 (1993).

The purpose of the invention was to develop a new type of gallium nitride substrates for epitaxial growth enabling to obtain structures of semiconductor light emitters without the disadvantages described above.

A substrate according to the invention is characterized in that its growth surface consists of set of neighbouring flat surfaces in form of stripes of a width from 1 to 2000 µm. Longer edges of the stripes are parallel one to another and planes of the stripes are disoriented relatively to the crystallographic plane defined by Miller-Bravais indices (0001), (10-10), (11-22) or (11-20). Disorientation angle of each of the flat surfaces is from 0 to 3 degree and is different for each of two neighbouring surfaces.

In one of variants of the substrate according to the invention all the flat surfaces are disoriented relatively to the crystallographic plane defined by the Miller-Bravais indices (0001).

In another variant of the substrate according to the invention the longer edges of all the flat surfaces are parallel to a given crystallographic direction of gallium nitride crystal while the flat surfaces are delimited by said longer edges and form over the whole crystal an array of repeating sequences.

In next variant of the substrate according to the invention the longer edges of all the flat surfaces are parallel to the crystallographic direction defined by Miller-Bravais indices [11-20].

In next variant of the substrate according to the invention the repeating sequence constitute a set of four neighbouring, consecutively, a first, a second, a first and a third flat surfaces. The first flat surface has a width from 500 to 2000 µm and disorientation angle from 0.3 to 1 degree. Widths of the second and the third flat surface are from 5 to 100 µm. Disorientation angle of the second flat surface is larger than the disorientation angle of the first flat surface by 0.9 to 2 degree, and disorientation angle of the third flat surface is smaller than the disorientation angle of the first flat surface by 0.9 to 2 degrees.

In next variant of the substrate according to the invention in the array of the flat surfaces forming repeating sequence in place of each first flat surface there are at least two fourth flat surfaces having a width of at least 10 µm each and disorientation angle amounting from 0.3 to 1 degree, whereby the total width of neighbouring the fourth flat surfaces is smaller than 2000 µm.

In another variant of the substrate according to the invention the longer edges of all the flat surfaces are parallel to crystallographic direction defined by Miller-Bravais indices [1-100].

In yet another variant of the substrate according to the invention all the flat surfaces are disoriented relatively to crystallographic plane (0001) in the direction [11-20], the repeating sequence of flat surfaces consists in an array of three neighbouring, consecutively, a first, a second and a third flat surfaces. The first flat surface has a width from 5 to 250 µm and a disorientation angle from 0.3 to 1 degree and constant over the whole area of gallium nitride crystal. Widths of the second and the third flat surfaces are from 5 to 290 µm. Disorientation angle of the second flat surface is larger than the disorientation angle of the first flat surface by 0.1 to 2 degrees. The disorientation angle of the third flat surface is smaller than the disorientation angle of the first flat surface by 0.1 to 2 degrees. The disorientation angles of each second and each third flat surface are different and the total number of all the second and the third flat surfaces does not exceed 200.

Invention concerning application relies on application a substrate according to the invention for fabrication of a laser diode of non-absorbing mirrors emitting the light of the wavelength from 380 to 550 nm or fabrication of a laser diode array emitting simultaneously light of various wavelengths in the range of 380 to 550 nm, based on a layered structure AlInGaN obtained in epitaxial MOCVD or MBE growth on a GaN crystalline substrate.

A method according to the invention relies on fabrication of a semiconductor light emitter, in particular a light emitting diode and a superluminescent diode having broadened emission spectrum, basing on a layered structure AlInGaN obtained in epitaxial MOCVD or MBE growth on the described above substrate according to the invention.

It unexpectedly appeared that the substrate according to the invention allows for the effective control of the lateral composition of the active layer of a laser. Thereby it was possible to fabricate easily and economically new quantum structures based on InGaAlN emitting in UV, violet blue and green spectral region, which earlier were not possible to be realized within group III metal nitride material system. The invention allows also for easy fabrication of superluminescent diodes characterized by a broad optical gain and emission spectra as well as laser diode arrays emitting simultaneously at various wavelength as well as improvement of known laser structures i.e. fabrication of laser diodes of non-absorbing mirrors.

The invention has been schematically shown in its embodiments in the attached drawing, on which FIG. 1 and FIG. 2 show accordingly a side and a top view of the first embodiment of a substrate according to the invention.

FIG. 3 and FIG. 4. show accordingly a side and a top view of the second embodiment of the substrate according to the invention.

This invention will be explained basing on three below exemplary embodiments. On each figure arrows show three basic crystallographic directions of the GaN crystal used for making the substrate.

EXAMPLE 1

Laser Diode of Non-Absorbing Mirrors

Figure 1:
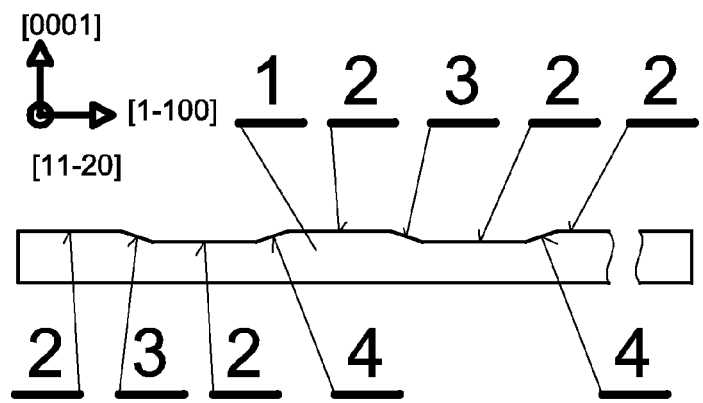
Figure 2:
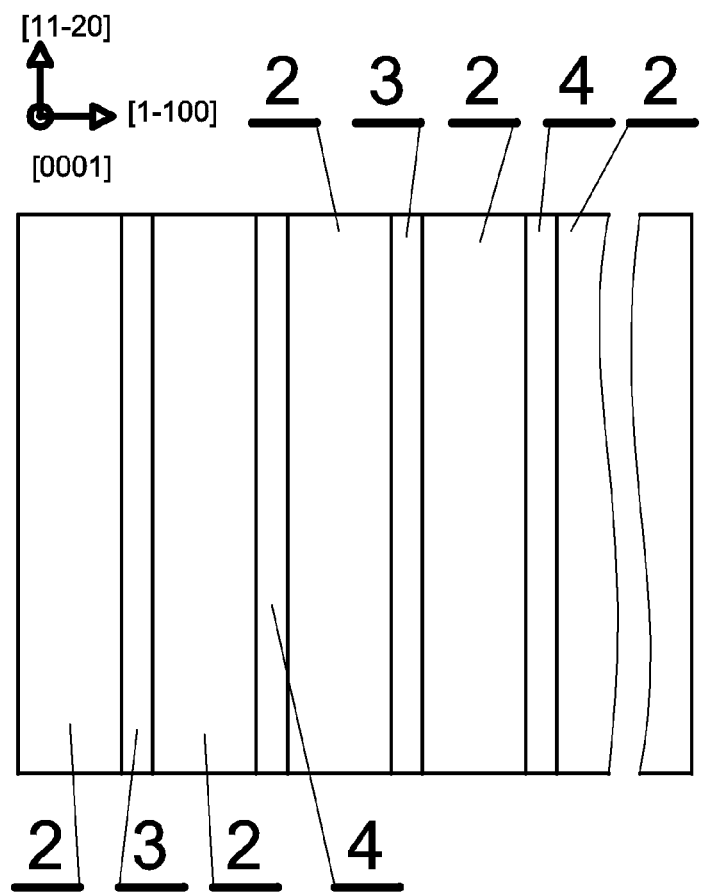
Figure 7:
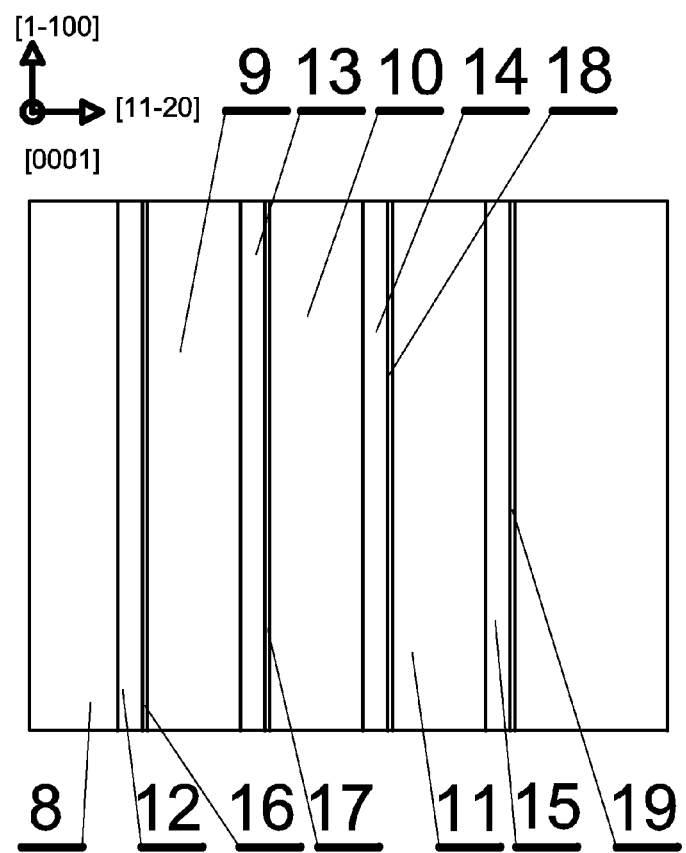
Figure 8:
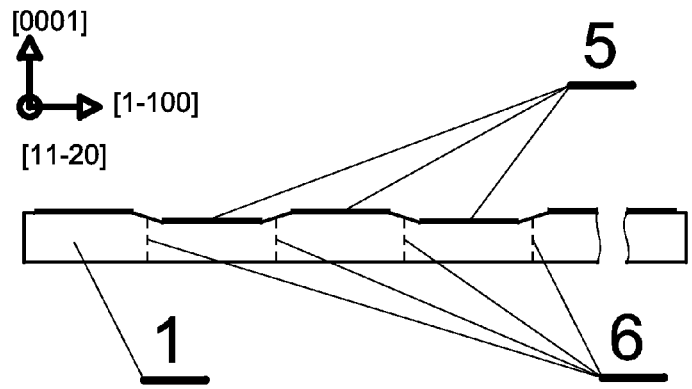
FIG. 8 and FIG. 9 show a side and a top view of a laser diodes structure of non-absorbing mirrors fabricated on the substrate shown in FIG. 1 and FIG. 2.
Figure 9:
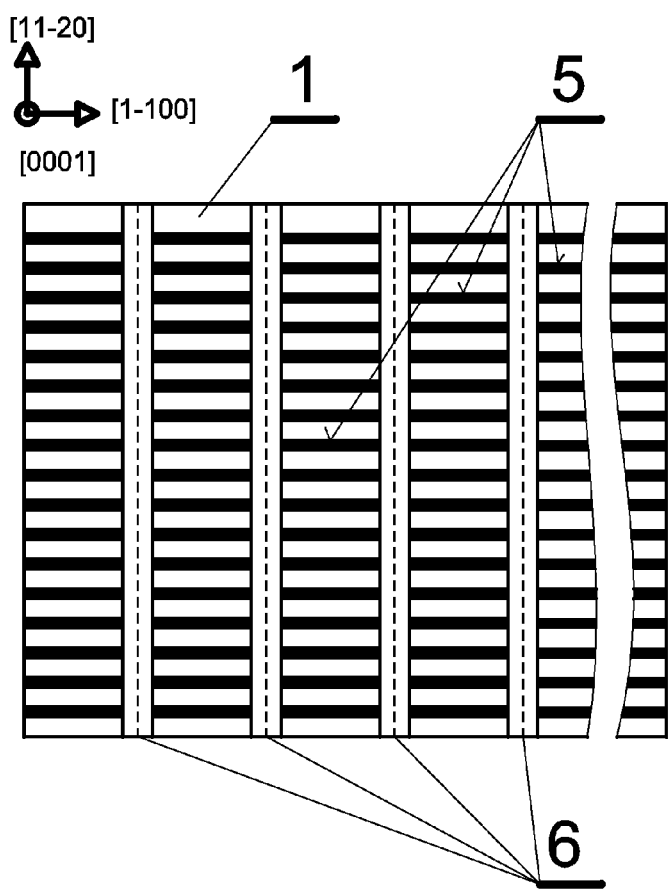

Substrate 1 for epitaxial growth was prepared from a monocrystalline gallium nitride forming a plane parallel platelet of the thickness of 120 µm. The gallium polar surface of the crystal was atomically flat after the mechanochemical polishing, showing atomic steps in the atomic force microscope image, and disorientation angle, defined as a angle between this surface and the crystallographic c direction of the hexagonal wurtzite structure defined by Bravais-Miller indices (0001), was 0.5 degree. Over so prepared surface the layer of the photosensitive emulsion of the thickness of 1.3 µm was span off. Then emulsion layer was exposed using a known laser photolithographic tool in such a way that various areas of this layer absorbed different doses of the radiation. These areas had the shapes of stripes having longer edges parallel one to the other and simultaneously parallel to the crystallographic direction having Miller-Bravais indices [11-20]. The crystallographic direction defined by the indices is an easy cleavage direction of GaN crystal. The width of the exposed stripes was alternated between 670 µm and 30 µm. The energy emitted during the exposure of every stripe area was varied along the direction perpendicular to [11-20] direction and this variation was formed as a sequence of four steps. The first step of the sequence was an exposure of the 670 µm stripe over which the laser of the photolithographic tool was off. The second step of the sequence consisted in the linear increase of the laser illumination from zero to maximum laser radiation dose during the exposure of the 30 µm stripe (second stripe) adjoining the (un)exposed previous (first) stripe. The variation of the dose was performed in the direction perpendicular to the crystallographic direction [11-20] and was increased counting from the edge common with said previous stripe. The third step of the sequence consisted in the exposure of the entire next stripe (i.e. third 670 µm stripe) with the maximum dose of illumination. The sequence was completed with the fourth step during which next stripe of 30 µm was exposed with the linearly varying dose in the same direction as in case of the second stripe but in contrast to the second stripe the dose was being decreased from maximum to zero. After the chemical developing, the thickness of the emulsion became a function of the exposure dose meaning thinner when more heavily exposed. And so the emulsion thickness on the third stripe was zero while on the second and the fourth stripe the thickness was varying linearly from 1.3 µm to 0 µm and from 0 µm to 1.3 µm accordingly. In next step the substrate with the layer of emulsion was subjected to Reactive Ion Etching in the mixture of Cl and Ar gases. During such process the etching medium attacks both the emulsion and the GaN crystal. In particular it is possible to find such parameters of the etching procedure that the etching rate of emulsion is almost equal to this of GaN. The time of etching was long enough to completely remove the emulsion in every of the four stripes areas in every stripe sequence. In such a way the variable profile of the emulsion thickness was reproduced in the GaN crystal as a sequence of flat surfaces having different angles of disorientation. In this embodiment the flat surfaces of the crystal located under the first and the third in the sequence emulsion stripes had the same disorientation angle (equal to the initial disorientation angle of the crystal i.e.; 0.5 degree) and they were called the first flat surfaces 2 of the substrate 1. The flat surfaces located under the second in the sequence emulsion stripes had the disorientation angle of 2.5 degree and they were called the second flat surfaces 3 of the substrate 1. Analogically, the flat surfaces of the crystal located under the fourth in the sequence emulsion stripes had a disorientation angle of −1.5 degree and they were called the third flat surfaces 4 of the substrate 1. On such prepared GaN crystal substrate (FIG. 1, FIG. 2) was conducted a laser diode structure MOVPE growth. The substrate 1 was placed in the MOVPE reactor where at the temperature about 1050° C. the first $Ga_{0.92}Al_{0.08}N$ layer was deposited. This layer had a thickness of 600 nm and was doped with Si to the level of $5 \times 10^{18}$ cm$^{-3}$. Next, at the same temperature, the layer of the undoped GaN of the thickness of 100 nm was grown and this layer played a role of lower waveguide. After lowering the growth temperature down to 820° C. the $In_{0.1}Ga_{0.9}N/In_{0.01}Ga_{0.99}N$ multi quantum layer was deposited and the number of repetition was three. Next, the reactor temperature was raised up to 1050° C. and the $Al_{0.12}Ga_{0.88}N$:Mg electron blocking layer was grown. After that an undoped GaN layer forming the top waveguide was formed. As a next layer, a top $Al_{0.08}Ga_{0.92}N$ cladding layer of a thickness of 350 nm was fabricated. The structure growth was completed with a thin GaN:Mg contact layer of the magnesium concentration higher than $10^{20}$ cm$^{-3}$. After the completion of the growth the reactor was filled with nitrogen and cooled down. Next on the surfaces of the laser diode structure n- and p-type contacts were deposited. The top contact had a shape of a stripe of the length from a range of 300 to 2000 µm and the width from a range of 1 to 100 µm. The metal contact annealing was performed at the temperatures lower than 390° C. The laser may be equipped with the 300-450 nm ridge waveguide structure for better confinement of the electro-magnetic mode. Thanks to the larger disorientation, within the second and the third flat surface the amount of incorporated indium is smaller than within the first flat surfaces (FIG. 7 and FIG. 8). As a consequence the energy gap of the material building an active layer of a laser is larger within second and third flat surfaces than within the first flat surfaces. In this embodiment laser mirrors plates are (1-100) planes which goes through the centers of the second 3 and the third 4 flat surfaces and the electric contacts does not exceed its first flat surfaces 2. Thanks to this the laser radiation is emitted at the energy characteristic for the energy gap of the material within the first flat surfaces. The radiation passes by the areas of the second and third flat surfaces and reaches the laser mirrors. It is worth noting that the radiation emitted with the energy characteristic for the material of the first flat surfaces is not absorbed in the areas of the second and third flat surfaces and thus consequently the mirror optical damage known in conventional laser diodes does not occur in such a structure since the band gap of semiconductor in the areas of first flat surfaces is smaller than that in the areas of the second and third flat surfaces. The final laser structure is schematically shown in FIG. 8 and FIG. 9 where the laser stripes were denoted with number 5 and the cleavage planes were denoted with number 6.

EXAMPLE 2

Fabrication of a Laser Diode with a Broadened Gain Spectrum

Figure 3:
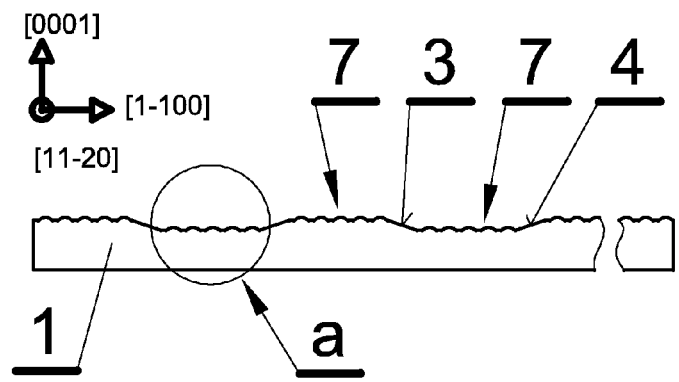
Figure 4:
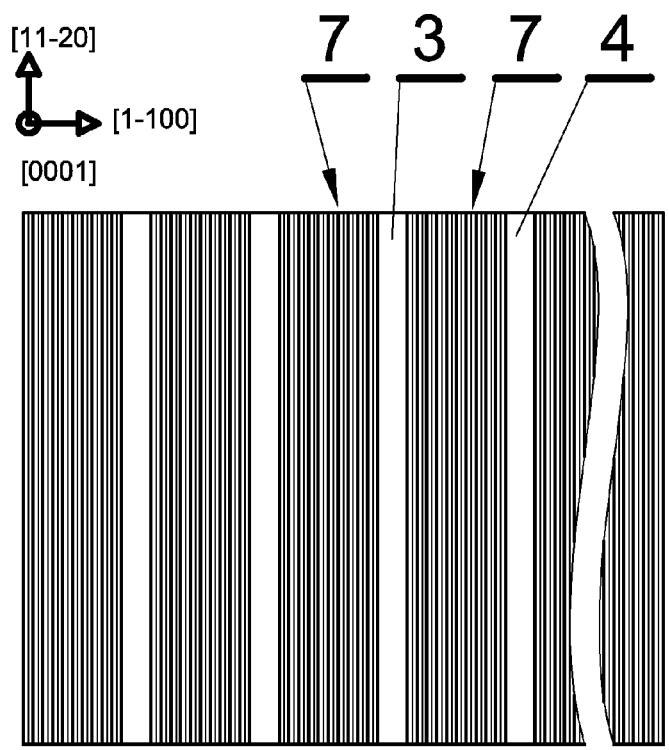
Figure 5:
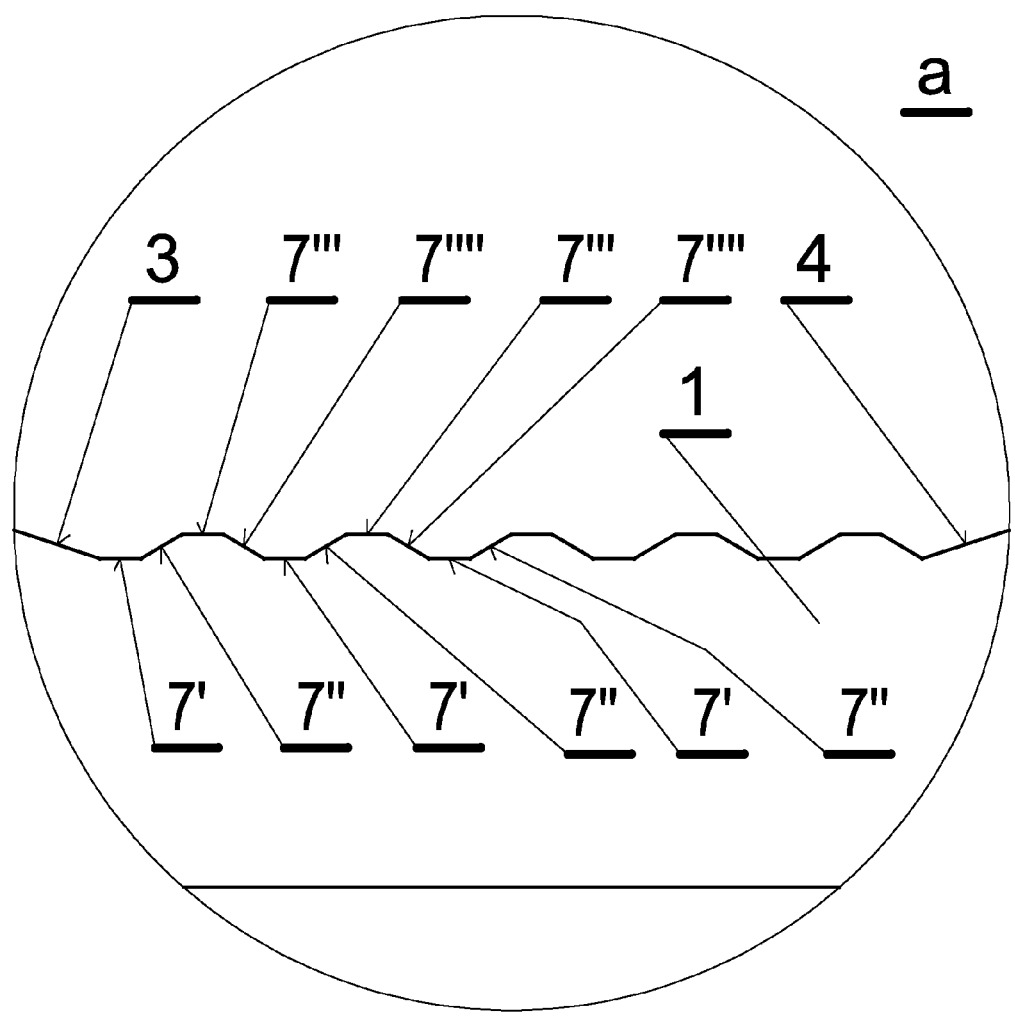
FIG. 5 shows enlarged part of FIG. 4.
Figure 10:
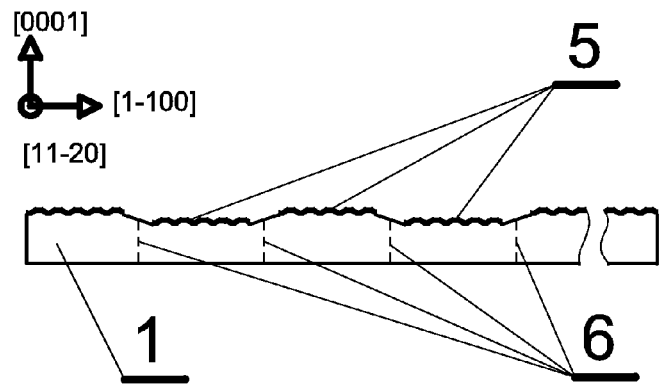
FIG. 10 and FIG. 11 show accordingly a side and a top view of a superluminescent diodes structure having a broadened optical spectrum.
Figure 11:
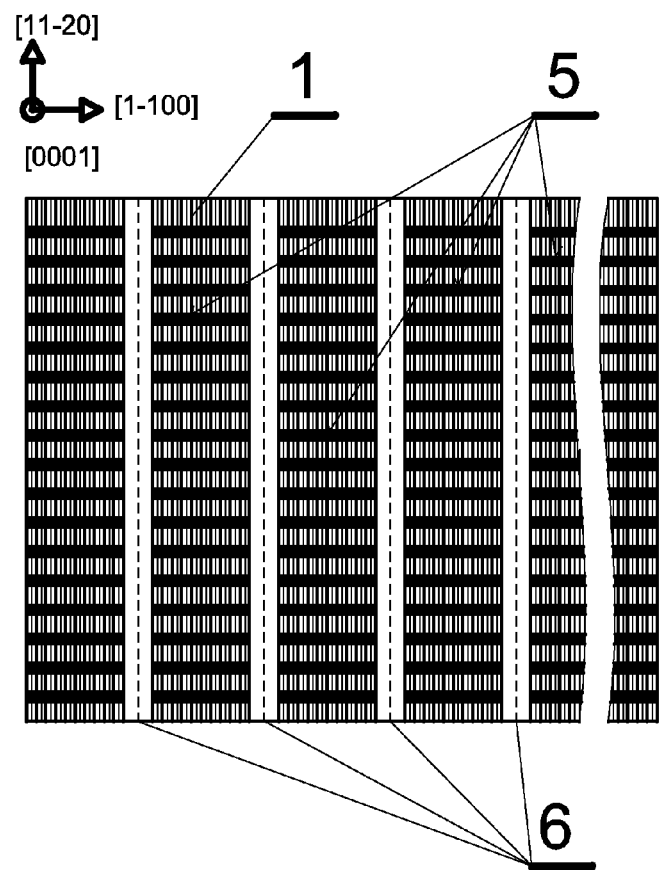
Figure 12:
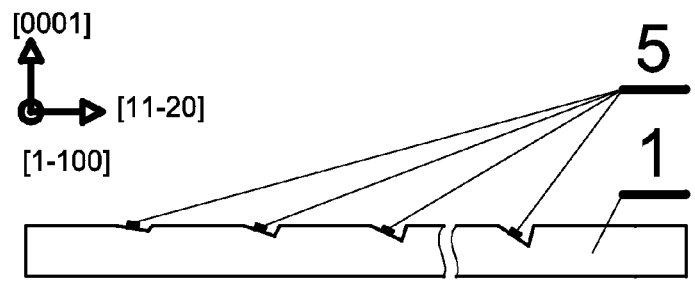
FIG. 12 and FIG. 13 show accordingly a side and a top view of a laser diode array emitting various wavelength and fabricated on the substrate shown in FIG. 6 and FIG. 7.
Figure 13:
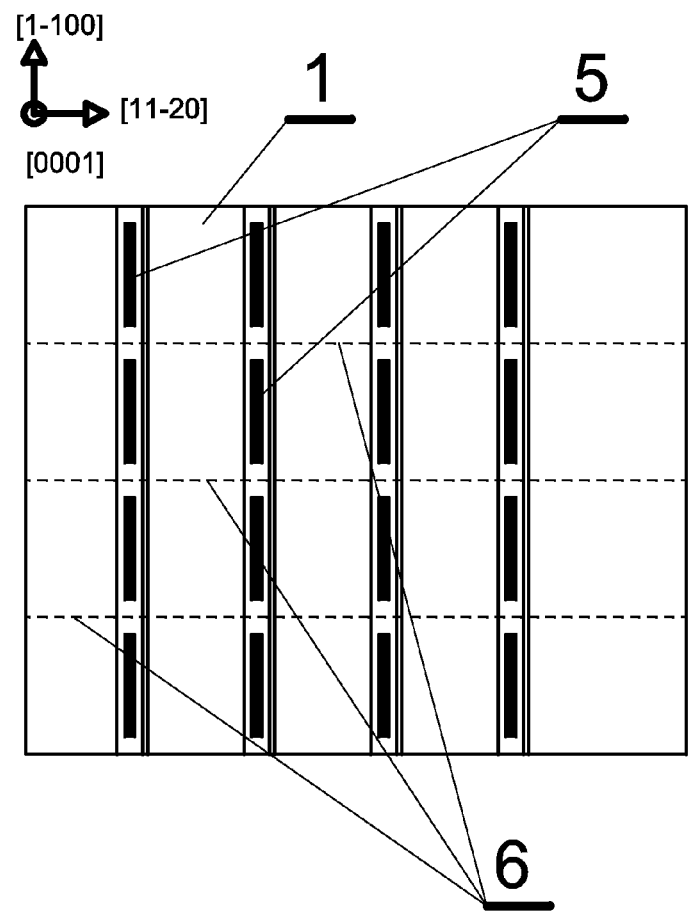

A plane parallel platelet of gallium nitride has been prepared and covered with photosensitive emulsion as in the Example 1. Similarly to the Example 1, using the laser photolithography tool successive emulsion stripes of the constant width were exposed with different doses. The stripe edges were parallel to the direction [11-20] of the gallium nitride crystal processed. One sequence of the changes of the laser exposure dose directed onto the emulsion consisted of 136 steps. With respect to the sequence of the Example 1, the second and forth steps were unchanged. Previous first and third steps conducted on a width of 670 μm were replaced by two sequences of sixty seven steps conducted on width 10 μm. The emulsion thickness in the first group of sixty seven adjacent 10 μm width stripes was sequentially changed in the following four substeps: linear increase of thickness from 0 to 0.05 μm, constant thickness of 0.05 μm, linear decrease of thickness from 0.05 μm to 0 μm and no emulsion (thickness 0 μm). In the second group of sixty seven 10 μm width stripes was sequentially changed in four substeps: linear decrease of thickness from 1.30 μm to 1.25 μm, constant thickness of 1.25 μm, linear increase of thickness from 1.25 μm to 1.30 μm and constant thickness of 1.30 μm. As a result of ion etching similar to that of the Example 1, variable profile of the emulsion thickness was reproduced onto the GaN crystal. Flat surfaces located below the emulsion stripes of 10 μm width were named forth flat surfaces 7. Disorientation of four subsequent fourth flat surfaces 7 obtained as a result of realization of the four substeps described above on the first and second group of sixty seven 10 μm width stripes was as following (FIG. 5): surface 7'—0.5 degree, surface 7"—0.2 degree, surface 7'''—0.5 degree and surface 7''''—0.8 degree. Disorientation angles of the second flat surfaces 3 amounted to 2.5 degrees and disorientation angles of the third flat surfaces 4 amounted to 1.5 degree. On such prepared GaN substrate crystal (FIG. 3 and FIG. 5) was made MOVPE epitaxial growth of laser diode in the same way as in the Example 1. Due to variable disorientation on the areas of the fourth flat surfaces a variable amount of indium was incorporated in the structure. In this way, energy gap of the quantum wells in the area of the second flat surfaces was variable. Such system had a capability of radiation emission in a much wider spectral range compared to the system of uniform disorientation and indium content in the quantum wells. Thanks to a larger disorientation, in the area of the second and third flat surfaces, less indium was incorporated as compared to the forth flat surfaces. Thanks to that, it was possible to avoid a harmful radiation absorption, what was described more precisely in the first Example. In this embodiment, the planes of laser diode mirrors are planes of Miller indices (1-100) crosssectioning the centers of the second and third areas of the flat substrate surfaces while electrical contacts does not exceed the areas of the four flat surfaces. Thanks to that, the radiation is emitted in a wide spectral range characteristic for the variable energy gap of the material in area of the second flat surfaces. The prepared laser structure is shown in FIG. 10 and FIG. 11, where the laser stripes are denoted with number 5 and the cleavage plane—with number 6.

EXAMPLE 3

Figure 6:
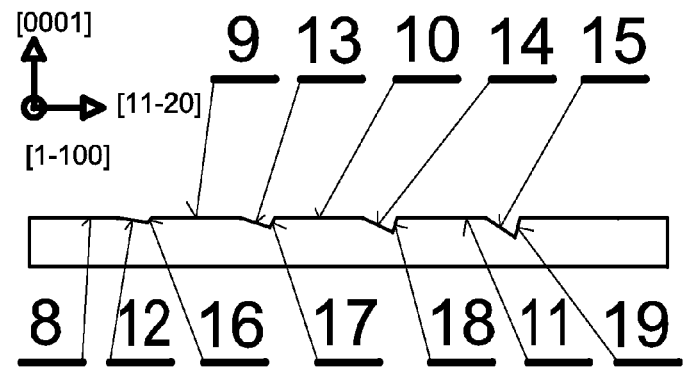
FIG. 6 and FIG. 7 show accordingly a side and a top view of a third embodiment of the substrate according to the invention.

Fabrication of Monolithic Array of Four Laser Diodes in which Each Diodes Emits Radiation of a Different Wavelength A plane parallel platelet of gallium nitride has been prepared and covered with photosensitive emulsion as in the Example 1. The crystal surface covered with the emulsion had a disorientation by 0.5 degree with respect to the direction of crystallographic axis c ([0001]) of the hexagonal structure of GaN (wurtzite) onto a direction of [11-20]. Similarly to the Example 1, using the laser photolithographic tool subsequent stripes of emulsion of the constant width were exposed with different doses. The stripe edges in this embodiment were parallel to the direction of [1-100] of the treated gallium nitride crystal. Similarly to the Example 1, using the ion etching, four sequences of disoriented flat surfaces in form of stripes of variable width were obtained (FIG. 6 and FIG. 7). Each sequence consisted of three adjacent flat surfaces: first (8, 9, 10 i 11), second (12, 13, 14 i 15) and third (16, 17, 18 i 19). Disorientation angle of all the first flat surfaces 8, 9, 10 and 11 was 0.5 degree due to presence of the photosensitive emulsion of a constant thickness of 1.3 μm in those areas. The disorientation angle in those areas did not change during the ion etching. Disorientation angles of other flat surfaces was obtained by using a linearly variable thickness of the photosensitive emulsion. In the first sequence, the first flat surface 8 had a width of 100 μm, the second flat surface 12 had a width of 100 μm and disorientation angle of 0.4 degrees, and the third flat surface 16 had a width of 100 μm and disorientation angle of 0.6 degrees.

The second sequence consisted of the first flat surface 10 of 10 μm width, of the second flat surface 13 of 280 μm width and 0.7 degree disorientation angle, and of the third flat surface 17 of a 10 μm width and 5.5 degree disorientation angle. The third sequence consisted of the first flat surface 10 of 80 μm width, of a second flat surface 14 of 140 μm width and 0.9 degree disorientation angle, and of the third flat surface 18 of 80 μm width and 0.2 degree disorientation angle. The last sequence consisted of the first flat surface 11 of 110 μm width, of the second flat surface 15 of 80 μm width and 1.1 degree disorientation angle, and of the third flat surface 19 of 110 μm width and 0 degree disorientation angle. On such prepared GaN substrate crystal was made epitaxial growth of laser diode structure in the same way as in the Example 1. Due to different disorientation in relation to axis c in areas of the individual flat surfaces different amounts of indium were incorporated. In this way, energy gap of the quantum wells forming laser active layer in the areas is different. The greater disorientation of given flat surface, the greater energy gap of semiconductor in its area. In this embodiment, the laser stripes 5 were made in the middle of the second flat surfaces 8, 9, 10 and 11. Thanks to that, the laser radiation was realized with energies characteristic for the quantum well energy gaps within area of each second flat surfaces. Due to the different disorientation of said flat surfaces a monolithic arrays of four laser diodes, each emitting in different wavelengths, were obtained. In this example, the wavelengths were as following:

390 nm, 400 nm, 410 nm and 420 nm. Fabricating the laser structure on a substrate with bigger number of sequences of the three flat surfaces 3 will make it possible to obtain arrays of larger number of colours.

The invention claimed is:

1. A substrate for epitaxial growth made of gallium nitride crystal, and having epi-ready growth surface, wherein the growth surface consists of a set of neighboring flat surfaces in a form of stripes of a width from 1 to 2000 µm, wherein longer edges of the stripes are parallel one to another, wherein planes of the stripes are disoriented relatively to the crystallographic plane defined by Miller-Bravais indices (0001), (10-10), (11-22) or (11-20) and wherein a disorientation angle of each of the flat surfaces is from 0 to 3 degrees and wherein the disorientation angle is different for each of two neighboring surfaces.

2. The substrate according to claim 1, wherein all the flat surfaces are disoriented relatively to the crystallographic plane defined by the Miller-Bravais indices (0001).

3. The substrate according to claim 2, wherein the longer edges of all the flat surfaces are parallel to a given crystallographic direction of gallium nitride crystal while the flat surfaces are delimited by said longer edges and form over the whole crystal an array of repeating.

4. The substrate according to claim 3, wherein the longer edges of all the flat surfaces are parallel to the crystallographic direction defined by Miller-Bravais indices.

5. The substrate according to claim 4, wherein the repeating sequence constitute a set of four neighboring flat surfaces consecutively, a first flat surface, a second flat surface, a first flat surface and a third flat surface wherein the first flat surface has a width from 500 to 2000 µm and a disorientation angle from 0.3 to 1 degree, wherein the widths of the second flat surface and of the third flat surface are from 5 to 100 µm, wherein a disorientation angle of the second flat surface is larger than the disorientation angle of the first flat surface by 0.9 to 2 degree, and wherein a disorientation angle of the third flat surface is smaller than the disorientation angle of the first flat surface by 0.9 to 2 degrees.

6. The substrate according to claim 5, wherein an array of the flat surfaces forming a repeating sequence in place of each first flat surface, there are at least two fourth flat surfaces having a width of at least 10 µm each and a disorientation angle amounting to from 0.3 to 1 degree, wherein a total width of neighboring fourth flat surfaces is smaller than 2000 µm.

7. The substrate according to claim 2, wherein the longer edges of all the flat surfaces are extending parallel to a crystallographic direction defined by Miller-Bravais indices.

8. The substrate according to claim 7, wherein all flat surfaces are disoriented relatively to a crystallographic plane (0001) in a direction of a repeating sequence of flat surfaces consists in an array of three neighboring flat surfaces consecutively forming a first flat surface, a second flat surface and a third flat surface wherein the first flat surface has a width from 5 to 250 µm and a disorientation angle from 0.3 to 1 degrees and constant over a whole area of a gallium nitride crystal, wherein widths of the second and the third flat surfaces are from 5 to 290 µm, wherein a disorientation angle of the second flat surface is larger than the disorientation angle of the first flat surface by 0.1 to 2 degrees, wherein the disorientation angle of the third flat surface is smaller than the disorientation angle of the first flat surface by 0.1 to 2 degrees, while the disorientation angles of each second and each third flat surface are different and the total number of all the second and the third flat surfaces does not exceed 200.

9. The substrate made of crystalline gallium nitride according to claim 1, wherein a growth surface for fabrication of a laser diode of non-absorbing mirrors emitting the light of a wavelength from 380 to 550 nm based on a layered structure AlInGaN obtained in epitaxial MOCVD or MBE growth on a GaN crystalline substrate.

10. The substrate made of crystalline gallium nitride according to claim 1, wherein a growth surface for fabrication of a laser diode array emitting simultaneously light of various wavelengths in a range of 380 to 550 nm based on a layered structure AlInGaN obtained in epitaxial MOCVD or MBE growth on a crystalline GaN substrate.

11. The substrate made of crystalline gallium nitride according to claim 1, wherein a light emitting diode and a super-luminescent diode and a superluminescent diode having a broadened emission spectrum, based on a layered structure AlInGaN obtained in epitaxial MOCVD or MBE growth on a crystalline substrate made of gallium nitride, wherein the epitaxial growth of said layered structure is performed on a substrate.

12. A substrate for epitaxial growth made of gallium nitride crystal, and having epi-ready growth surface, wherein the growth surface comprises a set of neighboring flat surfaces in a form of stripes of a width from 1 to 2000 µm, wherein longer edges of the stripes are parallel one to another, wherein planes of the stripes are disoriented relatively to the crystallographic plane defined by Miller-Bravais indices (0001), (10-10), (11-22) or (11-20) and wherein a disorientation angle of each of the flat surfaces is from 0 to 3 degrees and wherein the disorientation angle is different for each of two neighboring surfaces.

13. The substrate according to claim 12, wherein all the flat surfaces are disoriented relatively to the crystallographic plane defined by the Miller-Bravais indices (0001).

14. The substrate according to claim 13, wherein the longer edges of all the flat surfaces are parallel to a given crystallographic direction of gallium nitride crystal and wherein the flat surfaces are delimited by said longer edges and form an array of repeating over the whole crystal.

15. The substrate according to claim 14, wherein the longer edges of all the flat surfaces are parallel to the crystallographic direction defined by Miller-Bravais indices [11-20].

16. The substrate according to claim 15, wherein the repeating sequence constitute a set of four neighboring flat surfaces consecutively, a first flat surface, a second flat surface, a first flat surface and a third flat surface, wherein the first flat surface has a width from 500 to 2000 µm and a disorientation angle from 0.3 to 1 degree, wherein the widths of the second flat surface and of the third flat surface are from 5 to 100 µm, wherein a disorientation angle of the second flat surface is larger than the disorientation angle of the first flat surface by 0.9 to 2 degrees, and wherein a disorientation angle of the third flat surface is smaller than the disorientation angle of the first flat surface by 0.9 to 2 degrees.

17. The substrate according to claim 16, wherein an array of the flat surfaces forming a repeating sequence in place of each first flat surface, there are at least two fourth flat surfaces having a width of at least 10 µm each and a disorientation angle amounting to from 0.3 to 1 degree, wherein a total width of neighboring fourth flat surfaces is smaller than 2000 µm.

18. The substrate according to claim 13, wherein the longer edges of all the flat surfaces are extending parallel to a crystallographic direction defined by Miller-Bravais indices [1-100].

19. The substrate according to claim 18, all flat surfaces are disoriented relatively to a crystallographic plane (0001) in a direction of a repeating sequence of flat surfaces consists in an array of three neighboring flat surfaces consecutively forming a first flat surface, a second flat surface and a third flat surface, wherein the first flat surface has a width from 5 to 250 μm and a disorientation angle from 0.3 to 1 degrees and constant over a whole area of a gallium nitride crystal, wherein widths of the second and the third flat surfaces are from 5 to 290 μm, wherein a disorientation angle of the second flat surface is larger than the disorientation angle of the first flat surface by 0.1 to 2 degrees, wherein the disorientation angle of the third flat surface is smaller than the disorientation angle of the first flat surface by 0.1 to 2 degrees, while the disorientation angles of each second and each third flat surface are different and the total number of all the second and the third flat surfaces does not exceed 200.

20. The substrate made of crystalline gallium nitride according to claim 13, wherein a growth surface for fabrication of a laser diode of non-absorbing mirrors emitting the light of a wavelength from 380 to 550 nm based on a layered structure AlInGaN obtained in epitaxial MOCVD or MBE growth on a GaN crystalline substrate.

\* \* \* \* \*